(12) United States Patent
Huang et al.

(10) Patent No.: US 11,615,942 B2
(45) Date of Patent: Mar. 28, 2023

(54) CONTROL METHOD OF RADIOFREQUENCY SOURCE

(71) Applicant: BEIJING NAURA MICROELECTRONICS EQUIPMENT CO., LTD., Beijing (CN)

(72) Inventors: Yahui Huang, Beijing (CN); Gang Wei, Beijing (CN); Jing Wei, Beijing (CN); Juanjuan Li, Beijing (CN); Guodong Chen, Beijing (CN); Jing Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 70 days.

(21) Appl. No.: 17/279,916

(22) PCT Filed: Oct. 16, 2019

(86) PCT No.: PCT/CN2019/111500
§ 371 (c)(1),
(2) Date: Mar. 25, 2021

(87) PCT Pub. No.: WO2020/078393
PCT Pub. Date: Apr. 23, 2020

(65) Prior Publication Data
US 2021/0398776 A1    Dec. 23, 2021

(30) Foreign Application Priority Data
Oct. 18, 2018 (CN) .................... 201811218801.X

(51) Int. Cl.
*H01L 21/3065* (2006.01)
*H01J 37/32* (2006.01)

(52) U.S. Cl.
CPC .. *H01J 37/32091* (2013.01); *H01J 37/32174* (2013.01); *H01L 21/3065* (2013.01); *H01J 2237/3341* (2013.01)

(58) Field of Classification Search
CPC .......... H01J 37/32091; H01J 37/32174; H01J 2237/3341; H01J 37/32412;
(Continued)

(56) References Cited

U.S. PATENT DOCUMENTS 5,619,103 A * 4/1997 Tobin .................... H01J 65/048
315/111.21
2008/0053818 A1    3/2008 Ui
(Continued)

FOREIGN PATENT DOCUMENTS

AU    2011226881 A1 *  4/2012 ......... C23C 14/0036
CN         1110832 A      10/1995
(Continued)

OTHER PUBLICATIONS

China National Intellectual Property Organization The Third Office Action for CN201811218801.X dated Jul. 21, 2020 10 pages (with translation).
China National Intellectual Property Organization Notification to Grant Patent Right for CN201811218801.X dated Nov. 2, 2020 3 pages (with translation).
World Intellectual Property Organization (WIPO) International Search Report for PCT/CN2019/111500 dated Jan. 19, 2020 6 Pages (including translation).

*Primary Examiner* — Shamim Ahmed
(74) *Attorney, Agent, or Firm* — Anova Law Group, PLLC

(57) ABSTRACT

The present disclosure provides a radio frequency (RF) source control method. An RF source includes at least one pair of a main power supply and a secondary power supply with a same frequency. The RF source control method includes dividing each process step of process steps of a plasma process into a plurality of time periods, and when performing each process step, maintaining a common exciter (CEX) phase locking delay angle of the at least one
(Continued)

pair of the main power supply and the secondary power supply corresponding to each of the time periods at a predetermined value to provide an increased angular distribution uniformity of plasma. The RF source control method provided by the present disclosure may be used to adjust plasma distribution above a to-be-processed workpiece to average the plasma angular direction distribution of the entire process step as a whole to increase process uniformity of the to-be-processed workpiece.

16 Claims, 3 Drawing Sheets

(58) Field of Classification Search
CPC ........... H01J 37/32155; H01J 37/32311; H01J 37/32321; H01L 21/3065
USPC ..... 438/706, 710, 711, 712, 7, 14, 717, 719, 438/720, 736; 156/345.35, 345.47, 156/345.48
See application file for complete search history.

(56) References Cited

U.S. PATENT DOCUMENTS

| | | | |
|---|---|---|---|
| 2010/0224321 A1* | 9/2010 | Grimbergen | .......... H01J 37/321 156/345.24 |
| 2017/0084429 A1* | 3/2017 | Marakhtanov | ...... H01L 21/3065 |
| 2018/0082821 A1 | 3/2018 | Ikeda et al. | |
| 2018/0330921 A1* | 11/2018 | Radomski | .......... H01L 21/3065 |

FOREIGN PATENT DOCUMENTS

| | | |
|---|---|---|
| CN | 1191463 A | 8/1998 |
| CN | 103515178 A | 1/2014 |
| CN | 103715049 A | 4/2014 |
| CN | 104733278 A | 6/2015 |
| CN | 106920729 A | 7/2017 |
| CN | 108269726 A | 7/2018 |
| CN | 109273341 A | 1/2019 |
| TW | 201345322 A | 11/2013 |
| WO | WO-0106539 A1 * | 1/2001 ............ H01J 37/321 |

* cited by examiner

CONTROL METHOD OF RADIOFREQUENCY SOURCE

CROSS-REFERENCE TO RELATED APPLICATIONS

This application is a national phase entry under 35 U.S.C. § 371 of International Application No. PCT/CN2019/111500, filed on Oct. 16, 2019, which claims priority to Chinese Application No. 201811218801.X filed Oct. 18, 2018, the entire contents of both of which are incorporated herein by reference.

TECHNICAL FIELD

The present disclosure generally relates to the semiconductor manufacturing field and, more particularly, to a control method of a radiofrequency source.

BACKGROUND

As a feature size of an integrated circuit continues to shrink, requirements for the manufacturing process become more and more strict. One of the most important requirements is uniformity of a whole range of the to-be-processed workpiece. The better the uniformity of the whole range of the to-be-processed workpiece is, the higher the product yield is, and the lower the relative production cost is.

An inductively coupled plasma etching method is currently a common etching method in the integrated circuit field. FIG. 1 is a schematic structural diagram of existing inductively coupled plasma apparatus. A to-be-processed workpiece 9 is arranged on an electrostatic chuck 10. An upper electrode radiofrequency (RF) power supply 1 applies power to an outer coil 6 and an inner coil 7 of an inductively coupled coil through a matcher 2 and a current distribution unit 3. Radiofrequency energy is coupled to a reaction chamber 13 through a quartz window 8. A processing gas enters into the reaction chamber 13 through a nozzle 12 arranged at the quartz window 8. The RF energy excites the processing gas to generate plasma 11, which is used to perform etching on the to-be-processed workpiece. A lower electrode radio frequency power supply 5 applies RF energy to a radio frequency copper column located at the bottom of the electrostatic chuck through the matcher 4 to generate an RF bias and an ion acceleration shell layer at the surface of the to-be-processed workpiece 9, which allows the ions of the plasma to move towards the surface of the to-be-processed workpiece 9. In addition, devices for film transfer and air extraction is also arranged in the reaction chamber 13. These devices may affect structural symmetry in the reaction chamber 13 and thus affect etching uniformity.

To solve the problems in the etching uniformity, the current methods include adjusting the current distribution unit 3 to cause the power applied on the outer coil 6 and the inner coil 7 to be distributed proportionally. As such, the distribution uniformity of the plasma above the to-be-processed workpiece is improved and thus uniformity of an etching rate is improved.

In the process of implementing the present disclosure, Applicant of the present disclosure found the following deficiencies in the existing technology.

A manner of improving the etching uniformity by adjusting the current proportion of the inner and outer coils is limited by the coil structure and the current proportional adjustment unit. For some process gases, the adjustment of the current proportion makes little contribution to the etching uniformity. Moreover, this manner can play a more obvious role in the uniformity of a radial etching of the to-be-processed workpiece, but a limited role in the uniformity of an angular etching of the to-be-processed workpiece.

SUMMARY

According to the technical problem above, the present disclosure provides a radio frequency (RF) source control method to solve the problems of limited improvement of the existing technology for the uniformity of the angular distribution of the plasma.

According to an aspect of the present disclosure, an RF source control method is provided. An RF source includes at least one pair of a main power supply and a secondary power supply, with a same frequency. The RF source control method includes:

dividing each process step of process steps of a plasma process into a plurality of time periods; and when performing the process step, maintaining a common exciter (CEX) phase locking delay angle of the at least one pair of the main power supply and the secondary power supply corresponding to each of the plurality of time periods at a predetermined value to provid an increased angular distribution uniformity of plasma.

In some embodiments, predetermined values of the CEX phase locking delay angle corresponding to the plurality of time periods are distributed non-periodically in each process step.

In some embodiments, predetermined values of the CEX lock phase angel of adjacent time periods are different in each process step.

In some embodiments, the method further includes, according to a process condition of each process step, respectively determining a quantity of the time periods corresponding to each process step, process times corresponding to the time periods, and predetermined values of the CEX phase locking delay angle corresponding to the time periods.

In some embodiments, the method further includes:

pre-establishing a parameter comparison table, the parameter comparison table being used to record process conditions and the quantity of the time periods corresponding to each process step, the process times corresponding to the time periods, and the predetermined values of the CEX phase locking delay angle corresponding to the time periods; and during performing a current process step, obtaining a quantity of time periods of the current process step, process times corresponding to the time periods, and predetermined values of the CEX phase locking delay angle corresponding to the time periods according to the parameter comparison table.

In some embodiments, the process condition includes a process type and a process parameter.

In some embodiments, the process type includes a cleaning process, an etching process, and a deposition process; and the process parameter includes a type and a flow of a process gas.

In some embodiments, after completing a current process step, and before performing a next process step, the RF source control method further includes resetting the CEX phase locking delay angle to an initial value.

In some embodiments, for each pair of the main power supply and the secondary power supply, a phase angle of an output waveform of the main power supply and/or a phase angle of an output waveform of the secondary power supply are adjusted to change a phase difference between the main power supply and the secondary power supply to cause a value of the phase difference to equal to the predetermined value.

In some embodiments, the RF source includes a plurality of RF power supplies. One of the RF power supplies is used as a main power supply, and other RF power supplies are used as secondary power supplies and each paired with the main power supply. In each process step, the phase angle of the output waveform of the main power supply is maintained unchanged. Phase angles of output waveforms of all the secondary power supplies are adjusted to change phase differences between the main power supply and the secondary power supplies. The phase angles of the output waveforms of the secondary power supplies are maintained unchanged.

In some embodiments, the RF source includes a number M of RF power supplies arranged according to serial numbers. M is an integer greater than 1. An i-th RF power supply and an (i+1)-th RF power supply are paired as a pair of a main power supply and a secondary power supply. The i-th RF power supply is used as the main power supply, and the (i+1)-th RF power supply is used as the secondary power supply, where i=1, 2, ..., M−1. In each process step, for each pair of the main power supply and the secondary power supply, a phase angle of an output waveform of the main power supply is maintained unchanged, and a phase angle of an output waveform of the secondary power supply is adjusted to change a phase difference between the main power supply and the secondary power supply.

In some embodiments, the plasma process is used to process at least a batch of to-be-processed workpieces. Each batch includes a number L of to-be-processed workpieces. The plasma process includes a number N of process steps. L and N are integers greater than 1. For each batch of the to-be-processed workpieces, after a j-th to-be-processed workpiece is processed in a k-th process step, a (k+1)-th process step starts, and simultaneously a (j+1)-th to-be-processed workpiece is processed in the k-th process step, where j=1, 2, ..., L−1, and k=1, 2, ..., N−1.

In some embodiments, the plasma process is applicable to an inductively coupled plasma apparatus, a capacitively coupled plasma apparatus, a microwave plasma apparatus, and an electron cyclotron resonance plasma apparatus.

In the present disclosure, each of the process steps is divided into a plurality of time periods. The CEX phase locking delay angle of at least one pair of the main power supplies and the secondary power supplies is maintained at a predetermined value in the time periods to adjust the plasma distribution above the to-be-processed workpiece. As such, the plasma angular direction distribution of the entire process steps is averaged to improve the process uniformity of the to-be-processed workpiece.

REFERENCE NUMERAL

1—upper RF power supply; 2, 4—matcher; 3—current distribution unit; 5—lower RF power supply; 6—outer coil of inductively coupled coil; 7—inner coil of inductively coupled coil; 8—quartz window; 9—to-be-processed workpiece; 10—electrostatic chuck; 11—plasma; 12—nozzle; 13—reaction chamber.

DETAILED DESCRIPTION OF THE EMBODIMENTS

To make those of ordinary skill in the art to better understand the technical solutions of the present disclosure, a radio frequency (RF) control method provided by the present disclosure is described in detail below in connection with the accompanying drawings.

Figure 1:
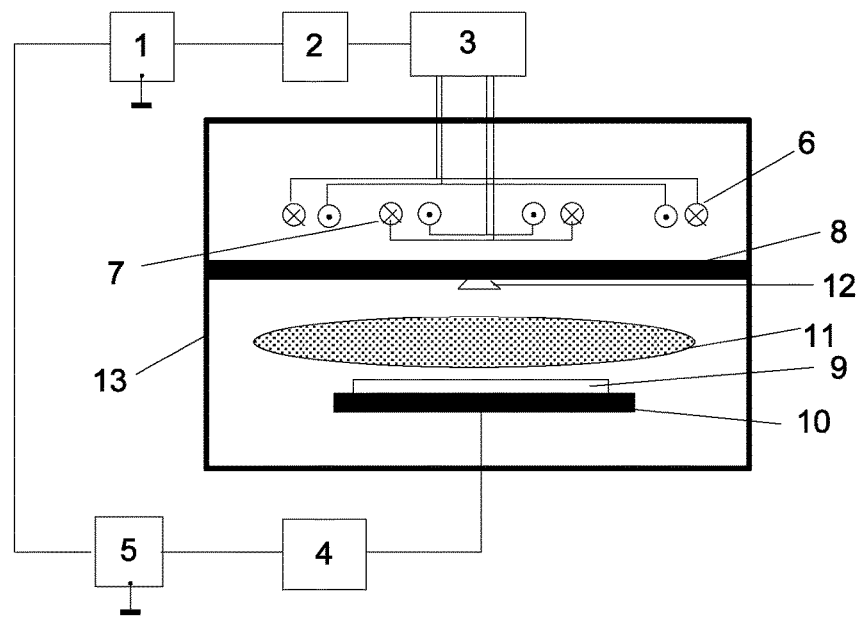
FIG. 1 is a schematic structural diagram of an existing ICP apparatus.

Taking inductively coupled plasma apparatus shown in FIG. 1 as an example, energy of an upper electrode RF power supply 1 coupled with a reaction chamber 13 includes a capacitive coupling part and an inductive coupling part. About 1/3 of the energy is capacitive coupling, and 2/3 of the energy is inductive coupling. However, energy of a lower electrode RF power supply 5 coupled with the reaction chamber 13 mainly includes capacitive coupling energy. By adjusting a phase difference between output waveforms of the upper electrode RF power supply 1 and the lower electrode RF power supply 5, that is, a common exciter (CEX) phase locking delay angle, the phase difference between the capacitive coupling energy of the upper electrode RF power supply 1 and the capacitive coupling energy of the lower electrode RF power supply 5 may be adjusted. Thus, ion energy and a sheath potential above the to-be-processed workpiece 9 may be affected to achieve the purpose of adjusting an angular distribution state of the plasma to change an etch rate of the to-be-processed workpiece 9 and distribution of points on the surface of the to-be-processed workpiece (i.e., Map distribution). That is, the CEX phase locking delay angle may directly affect the etch rate (ER) and the Map distribution.

Based on the above-mentioned principle, in the present disclosure, the process steps are divided into several time periods. A CEX phase locking delay angle of at least one pair of a main power supply and a secondary power supply with a same frequency (for example, the upper electrode RF power supply 1 and the lower electrode RF power supply 5 shown in FIG. 1) is maintained at a predetermined value in the time periods. Thus, the plasma distribution above the to-be-processed workpiece may be adjusted to make the plasma angular distribution of the process steps tends to be uniform as a whole. As such, the process uniformity of the to-be-processed workpiece may be increased.

To make the objectives, technical solutions, and advantages of the present disclosure clearer, the present disclosure is further described in detail in connection with specific embodiments and the accompanying drawings.

Figure 2:
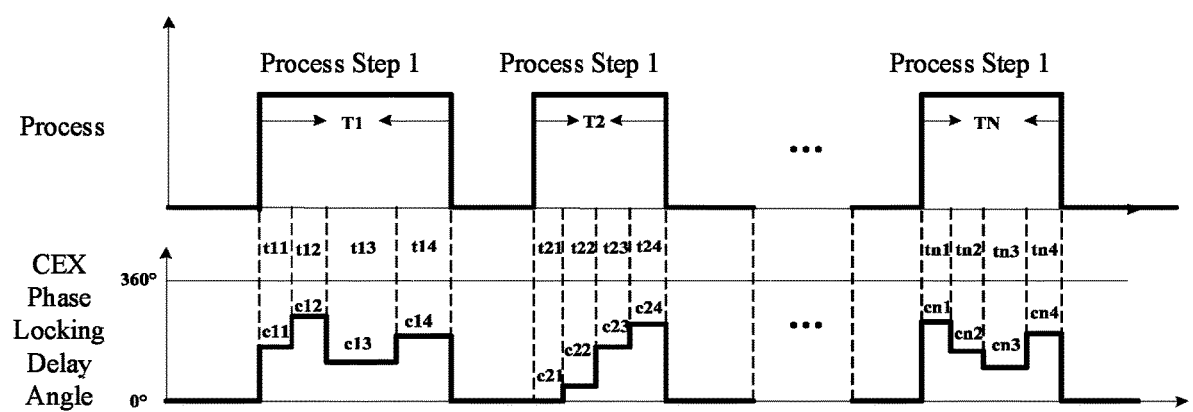
FIG. 2 is a schematic diagram showing a correspondence between the process steps and the CEX phase locking delay angle in a radio frequency (RF) source control method according to some embodiments of the present disclosure.

As shown in FIG. 2, embodiments of the present disclosure provide an RF source control method, which is suitable for performing a plasma process by using the inductively coupled plasma apparatus as shown in FIG. 1. The RF source of the apparatus includes the upper RF power supply 1 and the lower RF power supply 5 with a same frequency. The upper electrode RF power supply 1 is set as the main power supply, the lower electrode RF power supply 5 is set as the secondary power supply, and the two are set as a pair.

The plasma process includes a number N of process steps, which is process step 1, process step 2, . . . , process step N. Process times for the process steps are T1, T2, . . . , TN. For each process step, the process step is divided into four time periods according to its process condition. During the process steps, the method includes maintaining the CEX phase locking delay angle of at least one pair of the main power supply and the secondary power supply corresponding to each time period at a predetermined value.

Specifically, the process time of process step 1 is T1. Process step 1 is divided into four time periods. Process times corresponding to the four time periods are t11, t12, t13, and t14, respectively. The sum of the process times (t11+t12+t13+t14) of the four time periods is equal to process time T1 of process step 1. Predetermined values of the CEX phase locking delay angle in the four time periods are c11, c12, c13, and c14, respectively. The to-be-processed workpiece first enters process step 1. When performing process step 1, the method includes performing process step 1 first with a first predetermined value c11 of the CEX phase locking delay angle for t11 in a first time period, CEX phase locking delay angle, then switching to a second time period, and with a second predetermined value c12 of the CEX phase locking delay angle for t12, then entering a third time period, and with a third predetermined value c13 of the CEX phase locking delay angle for t13, and finally in a fourth time period, with a fourth predetermined value c14 of the CEX phase locking delay angle for t14, and ending process step 1.

After that, the to-be-processed workpiece enters process step 2 from process step 1. Process step 2 is divided into four time periods. Process times corresponding to the four time periods are t21, t22, t23, and t24, respectively. The predetermined values of the CEX phase locking delay angle in the four time periods are c21, c22, c23, and c24, respectively. When performing process step 2, the method includes performing process step 2 first with a first predetermined value c21 of the CEX phase locking delay angle for t21 in a first time period. When switching to a second time period, the method includes performing process step 2 with a second predetermined value c22 of the CEX phase locking delay angle for t22. When entering a third time period, the method includes performing process step 2 with a third predetermined value c23 of the CEX phase locking delay angle for t23. Finally, in a fourth time period, the method includes performing process step 2 a fourth predetermined value c24 of the CEX phase locking delay angle for t24 and ending process step 2.

By analogy, the to-be-processed workpiece finally enters process step N. Process step N is divided into four time periods, and process times corresponding to the four time periods are tn1, tn2, tn3, and tn4, respectively. The predetermined values of the CEX phase locking delay angle corresponding to the four time periods are cn1, cn2, cn3, and cn4, respectively. When performing process step N, the method includes performing process step N first with a first predetermined value cn1 of the CEX phase locking delay angle for tn1 in a first time period. When switching to a second time period, the method includes performing process step N with a second predetermined value cn2 of the CEX phase locking delay angle for tn2. When entering a third time period, the method includes performing process step N with a third predetermined value cn3 of the CEX phase locking delay angle for tn3. Finally, in a fourth time period, the method includes performing process step N a fourth predetermined value cn4 of the CEX phase locking delay angle for tn4 and ending process step N and the whole process.

Figure 3:
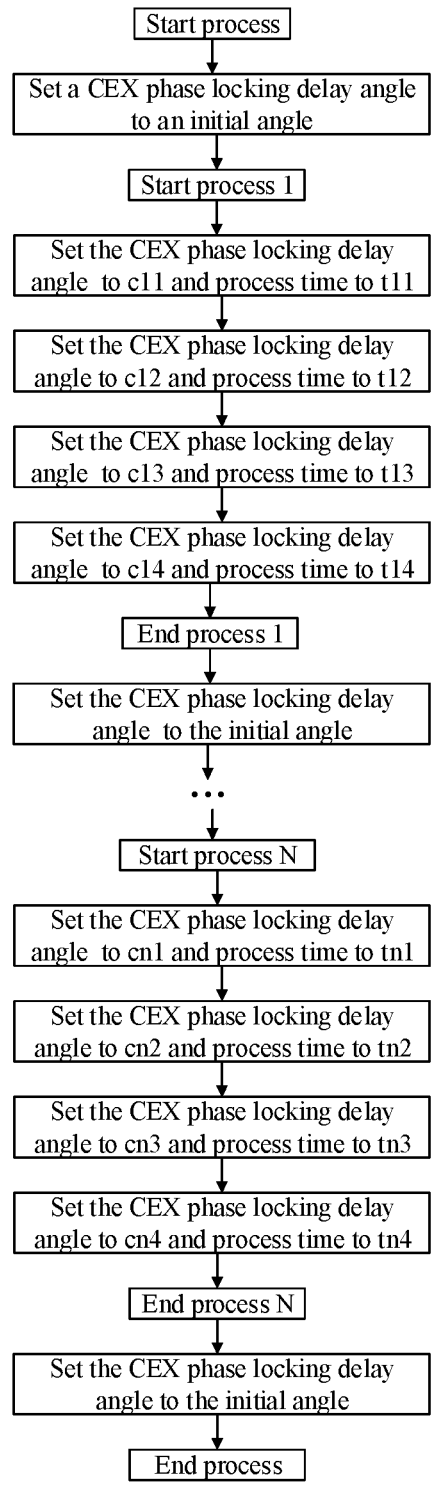
FIG. 3 is a schematic flowchart of the RF source control method shown in FIG. 2.

The flowchart of the above-mentioned RF source control method is shown in FIG. 3. During the process of sequentially executing process step 1 to process step N, the method includes adjusting the size of the CEX phase locking delay angle of process step 1 to process step N separately in the time periods. A specific adjustment method includes, for example, in each process step, maintaining a phase angle of a output waveform of the main power supply unchanged, and adjusting a phase difference between the main power supply and the secondary power supply by only changing a phase angle of a output waveform of the secondary power supply. The phase difference is the CEX phase locking delay angle. Of course, in practical applications, the method includes only adjusting the phase angle of the output waveform of the main power supply or adjusting both of the phase angles of the output waveforms of the main power supply and the secondary power supply simultaneously, so as to change the phase difference between the main power supply and the secondary power supply to make the value of the phase difference to equal to a predetermined value.

After starting the process, the method includes setting an initial value of the CEX phase locking delay angle between the main power supply and the secondary power supply. Process step 1 starts, the method includes performing process step 1 in its four time periods in sequence, setting a predetermined value of the CEX phase locking delay angle in each time period, and performing process step 1 for the corresponding process times until process step 1 ends. After the process step 1 ends, the CEX phase locking delay angle is restored to the initial value, and then process step 2 is performed. By analogy, process step N starts, the method includes performing process step N in its four time periods in sequence, setting a predetermined value of the CEX phase locking delay angle in each time period, and performing process step N for the corresponding process times until process step N ends. When the entire process ends, the CEX phase locking delay angle is also restored to the initial value.

The RF source control method provided by embodiments of the present disclosure includes dividing the process steps into a plurality of time periods and maintaining the CEX phase locking delay angle of the main power supply and the secondary power supply at a predetermined value in the time periods to adjust the plasma distribution above the to-be-processed workpiece. Thus, the plasma angular distribution of the entire process steps may be averaged as a whole to increase the process uniformity of the to-be-processed workpiece.

Optionally, in each process step, the predetermined values of the CEX phase locking delay angle corresponding to the plurality of time periods are distributed non-periodically. Non-periodical distribution may refer to an irregular distribution from the perspective of the entire process steps. In practical applications, some process conditions of some process steps (e.g., process type, process parameters, etc.) are often irregular. In this case, the CEX phase locking delay angle corresponding to each time period may be set according to the process condition corresponding to the time period, in which the CEX phase locking delay angle is, and may not be required to follow the law of time. Meanwhile, by setting the CEX phase locking delay angle according to the process condition corresponding to the time period, in which the CEX phase locking delay angle is. That is, by using a non-periodical distribution method, the plasma angular distribution of the entire process steps may be averaged as a whole to improve the consistency of the process result.

An etching process is taken as an example to further illustrate an effect of embodiments of the present disclosure. Assuming that the etching process includes an etching step (process step) with a process time of 30 s. The etching step may be divided into four time periods. Firstly, the etching step is performed in a first time period, a first predetermined value of the CEX phase locking delay angle of the first time period is 35°, and the process time is 9 s. Then, the etching step is performed in a second time period, a second predetermined value of the CEX phase locking delay angle of the second time period is 115°, and the process time is 5 s. Then, the etching step is performed in a third time period, a third predetermined value of the CEX phase locking delay angle of the third time period is 260°, and the process time is 10 s. Finally, the etching step is performed in a fourth time period, a fourth predetermined value of the CEX phase locking delay angle of the fourth time period is 340°, and the process time is 6 s.

During performing the whole etching step, the predetermined values of the CEX phase locking delay angle in adjacent time periods may be different. Thus, for the whole etching step, the predetermined values of the CEX phase locking delay angle may present a step change. With the influence of the step change, for each point on the surface of the to-be-processed workpiece, the plasma energy and the sheath potential above the to-be-processed workpiece may change stepwise as the etching step is performed in each time period in sequence. For the points on the surface of the to-be-processed workpiece on a same circumference, in the same time period, the etching rates are different for different points. However, in different time periods, the etching rates of the same point are different. Thus, even if there is a difference in the etching rates between different points in the same time period, by making the etching rates of the same point to be different in different time periods, the etching rates between the different points may be compensated. As such, the etching rates between different points may tend to be same after a complete process step, and finally, the plasma angular distribution of the entire process step may be averaged as a whole.

Figure 4:
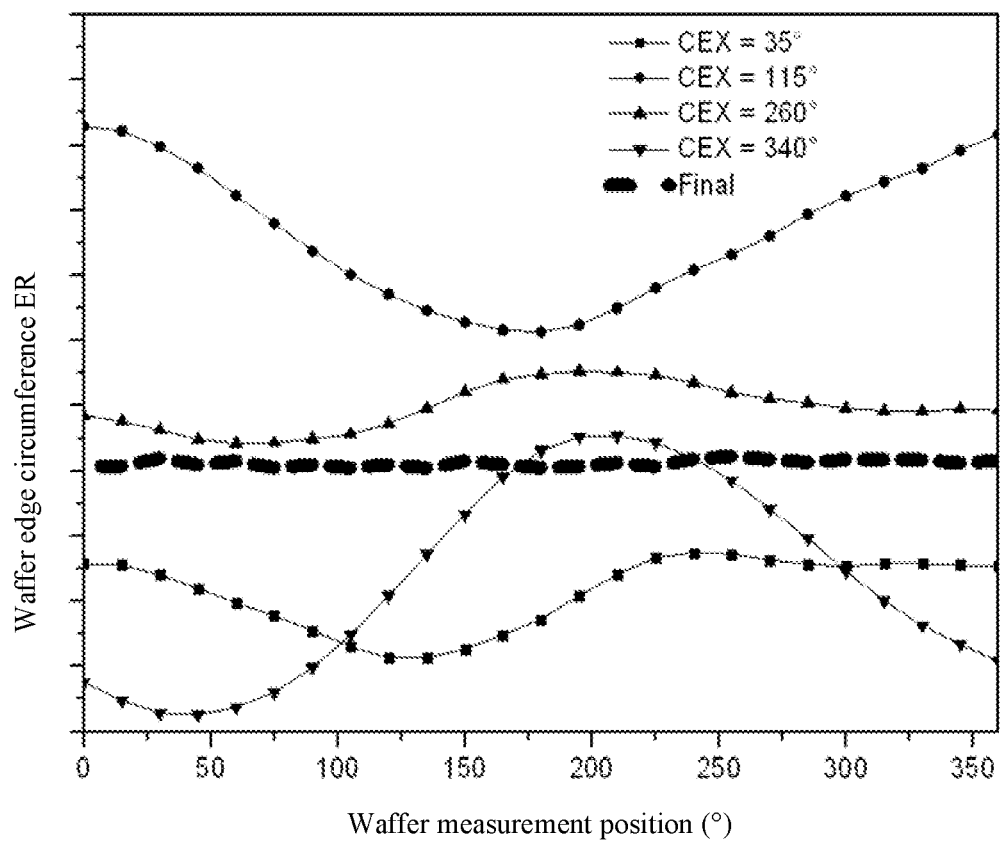
FIG. 4 is a schematic diagram of relationship among an angular position of the to-be-processed workpiece, the CEX phase locking delay angle, and an angular etching rate of the edge of the to-be-processed workpiece according to some embodiments of the present disclosure.

FIG. 4 shows the final etching result of the etching step. A Final dashed line shown in FIG. 4 represents a correspondence between the positions of the points and the etching rates in an angular direction (circumferential direction) of the surface of the to-be-processed workpiece. The Final dotted line is basically a straight line and indicates that average etching rates of the points in the angular direction of the to-be-processed workpiece are basically same, which greatly increases the angular uniformity of the etching rates.

It needs to be noted that, according to the process condition of each process step, another adjustment method of the CEX phase locking delay angle may also be adopted, for example, the predetermined values of CEX phase lock angle corresponding to the plurality of time periods are periodically distributed.

Only the etching process is taken as an example to further illustrate embodiments of the present disclosure. However, embodiments of the present disclosure are not limited to this. Those skilled in the art should understand that the plasma process method of embodiments of the present disclosure may be applicable to any process steps, including but not limited to cleaning, deposition, etc.

It needs to further be noted that, a quantity of the time periods of the process step is not limited to four. The process times of the time periods may be same or also be different. The predetermined values of the CEX phase locking delay angle of the time periods are not limited to the above-mentioned values.

In practical applications, according to the process condition of each process step, the quantity of the corresponding time periods, the process times corresponding to the time periods, and the predetermined values of the CEX phase locking delay angle corresponding to the time periods are determined, respectively. The process conditions may refer to the process type and the process parameters. The process type may include a cleaning process, an etching process, a deposition process, etc. The process parameters usually refer to the type and flow of the process gas.

Optionally, the RF source control method also includes pre-establishing a parameter comparison table. The parameter comparison table is used to record the process conditions of the process steps and the quantity of the time periods corresponding to the process conditions, the process times corresponding to the time periods, and the predetermined values of the CEX phase locking delay angle corresponding to the time periods. The RF source control method also includes in the process of performing the current process step, obtaining the quantity of the time periods of the current process step, the process times corresponding to the time periods, and the predetermined values of the CEX phase locking delay angle corresponding to the time periods according to the parameter comparison table.

Specifically, Table 1 shows a parameter comparison table. The parameter comparison table corresponds to a process step. The process step includes a number n of time periods (1,2, . . . , n), process time (tn1, tn2, . . . , tnn) of n time periods, and n predetermined values (cn1, cn2, . . . , cnn) of the CEX phase locking delay angle of the number n of time periods.

TABLE 1 parameter comparison table.

| Time period | Process Time/s | CEX Lock Phase Angel/° |
|---|---|---|
| 1 | tn1 | cn1 |
| 2 | tn2 | cn2 |
| . . . | . . . | . . . |
| n | tnn | cnn |

By pre-establishing the parameter comparison table, when the process steps are performed, the parameter comparison table can be directly called according to the process conditions of the current process step. The process steps may be directly performed according to the parameters recorded in the parameter comparison table.

For an RF source control method of other embodiments of the present disclosure, for the sake of brevity, the same or similarities are not repeated, and only the differences are described in detail below.

In some embodiment, the radio frequency source of the inductively coupled plasma apparatus may include a plurality of RF power supplies (e.g., more than three), one of the radio frequency power supplies may be used as a main power supply, and other RF power supplies may be used as secondary power supplies and each paired with the main power supply, that is, the secondary power supplies may correspond to the same main power supply. In this case, in each process step, the phase angle of the output waveform of the main power supply may be maintained unchanged. The phase angles of the output waveforms of the secondary power supplies may be adjusted to adjust the predetermined values of the CEX phase locking delay angle of the main power supply and the secondary power supplies. The phase angles of the output waveforms of the secondary power supplies may remain consistent.

For an RF source control method of other embodiments of the present disclosure, for the sake of brevity, the same or similarities are not repeated, and only the differences are described in detail below.

In some embodiments, the RF source may also include a number M of RF power supplies arranged in sequence numbers. M may be an integer greater than 1 (e.g., M being greater than or equal to 3). An i-th RF power supply may be paired with an (i+1)-th RF power supply as a pair of a main power supply and a secondary power supply. The i-th RF power supply may be used as the main power supply, and the (i+1)-th RF power supply may be used as the secondary power supply. i is equal to 1, 2, . . . , M−1. For example, a first RF power supply may be used as a main power supply, a second RF power supply may be used as a secondary power supply of the first RF power supply, and simultaneously as a main power supply of a third RF power supply. The third RF power supply may be used as a secondary power supply of the second RF power supply, and simultaneously as a main power supply of a fourth RF power supply, and so on. An (M−1)-th RF power supply may be used as a secondary power supply of an (M−2)-th RF power supply, and simultaneously as a main power supply of an M-th RF power supply. The M-th RF power supply may be used as a secondary power supply of the (M−1)-th RF power supply.

In the process step, for the pairs of the main and secondary power supplies, the phase angles of the output waveforms of the main power supplies are maintained unchanged. Only the phase angles of the output waveforms of the secondary power supplies may be changed to adjust the phase angles of the main power supplies and the secondary power supplies, that is, the CEX phase locking delay angle s. As such, the CEX phase locking delay angle s of the pairs of main and secondary power supplies may remain consistent.

The RF power supplies may be RF power supplies with any frequency. Frequencies of a same pair of main and secondary power supplies may be same, for example, the frequency of the RF power supply may include 400 KHz, 2 KHz, 13.5 KHz, 60 MHz, etc.

It needs to be noted that, in above embodiments, the phase angles of the output waveforms of the main power supplies are maintained unchanged. Only the phase angles of the output waveforms of the secondary power supplies are changed to adjust the CEX phase locking delay angle s of the main power supplies and the secondary power supplies. However, the present disclosure is not limited to this. The phase angles of the output waveforms of the secondary power supplies may be maintained unchanged. Only the phase angles of the output waveforms of the main power supplies, or the phase angles of the output waveforms of the main power supplies and the secondary power supplies may be changed simultaneously to adjust the CEX phase locking delay angle s.

For an RF source control method of other embodiments of the present disclosure, for the sake of brevity, the same or similarities are not repeated, and only the differences are described in detail below.

For a situation of the plasma process processing at least a batch of to-be-processed workpieces, a plurality of to-be-processed workpieces of a same batch may be processed simultaneously. Specifically, assuming that each batch may include a number L of to-be-processed workpieces. The plasma process may include a number N of process steps. L and N may be both integers greater than 1.

For each batch of the to-be-processed workpieces, after a j-th to-be-processed workpiece is processed at a k-th process step, a (k+1)-th process step starts, and a (j+1)-th to-be-processed workpiece is processed simultaneously at the k-th process step, where j=1, 2, . . . , L−1, and k=1, 2, . . . , N−1.

For example, after a first is processed at process step 1, the first to-be-processed workpiece may continue to be processed by entering process step 2A second to-be-processed workpiece may be processed by entering process step 1, and so on, until to-be-processed workpieces are being processed at all process steps 1 to N. In this case, process steps 1 to N are performed simultaneously. The RF source control method of embodiments of the present disclosure may simultaneously adjust the CEX phase locking delay angle s of process steps 1 to N in time periods. For each process step, the quantity of the time periods of the process steps, the process times of the time periods, and the predetermined values of the CEX phase locking delay angle s may be determined according to the process condition. For the specific adjustment process of the process steps, reference may be made to above embodiments.

The RF source control method of the present disclosure is described in detail by using the inductively coupled plasma apparatus to perform the plasma process method, however, the present disclosure is not limited to this. In fact, the RF source control method of the present disclosure is applicable to various plasma apparatus, such as an inductively coupled plasma apparatus, a capacitively coupled plasma apparatus, microwave plasma apparatus, an electron cyclotron resonance plasma apparatus, etc.

In summary, in the present disclosure, each process step of the plasma process may be divided into a plurality of time periods. The CEX phase locking delay angle of at least one pair of main power supplies and secondary power supplies in the time periods may be maintained at a predetermined value. Thus, the plasma distribution above the to-be-processed workpiece can be adjusted to average the plasma angular distribution of the entire process step as a whole to increase the process uniformity of the to-be-processed workpiece.

Embodiments of the present disclosure are described in detail in connection with the accompanying drawings. Based on the above description, those skilled in the art may have a clear understanding of the present disclosure.

Specific embodiments described above further describe the purpose, technical solutions, and beneficial effects of the present disclosure in detail. It should be understood that the above are only specific embodiments of the present disclosure and are not intended to limit the present disclosure. Within the spirit and principle of the present disclosure, any modification, equivalent replacement, improvement, etc., shall be within the scope of the present disclosure.

It should also be noted that the directional terms mentioned in embodiments of the present disclosure, such as "upper," "lower," "front," "rear," "left," "right," etc., are only directions with reference to the drawings, which are not used to limit the scope of the present disclosure. Throughout the drawings, same elements are represented by same or similar reference signs. When it may cause confusion in the understanding of the present disclosure, conventional structures or configurations may be omitted.

Unless otherwise specified, numerical parameters in this specification and the appended claims are approximate values and can be changed according to the required characteristics obtained through the content of the present disclosure. Specifically, all numbers used in the specification and claims to indicate the content of the composition, reaction conditions, etc., should be understood as being associated by the term "about" in all cases. In general, the numbers indicate that specific numbers have a change of ±10% in some embodiments, a change of ±5% in some embodiments, a change of ±1% in some embodiments, a change of ±1% in some embodiments, and a change of ±0.5% in some embodiments.

Furthermore, the word "include" does not exclude the presence of elements or steps not listed in the claims. The word "a" or "an" preceding an element does not exclude the presence of multiple such elements.

The ordinal numbers used in the specification and claims, such as "first," "second," "third," etc., are used to describe the corresponding elements, and do not imply and represent that the elements have any ordinal numbers, or does not represent the order of a certain element and another element, or the order in the manufacturing method. These ordinal numbers are only used to clearly distinguish one element with a certain name from another element with the same name.

Similarly, it should be understood that in order to simplify the present disclosure and help understand one or more of various disclosed aspects, in the above description of exemplary embodiments of the present disclosure, various features of the present disclosure are sometimes grouped together into a single embodiment, figure, or its description. However, the disclosed method should not be interpreted as reflecting the intention that the claimed invention requires more features than those explicitly recorded in each claim. More precisely, as reflected in the following claims, the disclosure aspect has less features than all the features of a single embodiment previously disclosed. Therefore, the claims following specific embodiments are thus explicitly incorporated into the specific embodiments. Each claim itself is used as a separate embodiment of the present disclosure.

What is claimed is:

1. A plasma process method, wherein a plasma is excited using at least one pair of a main power supply and a secondary power supply, the plasma process method comprising:
   at least a process step;
   dividing each process step into a plurality of time periods; and
   maintaining a common exciter (CEX) phase locking delay angle of the at least one pair of the main power supply and the secondary power supply corresponding to each of the time periods at a value, by adjusting a phase difference between output waveforms of the main power supply and the secondary power supply of the at least one pair of the main power supply and the secondary power supply, to provide an increased plasma angular distribution uniformity;
   wherein values of CEX phase locking delay angles of the plurality of time periods in each process step are distributed non-periodically.

2. The plasma process method according to claim 1, wherein the values of the CEX phase locking delay angles of the plurality of time periods of each process step change in steps.

3. The plasma process method according to claim 1, wherein the at least a process step includes a plurality of process steps, and the plurality of process steps are performed simultaneously.

4. The plasma process method according to claim 1, wherein for each process step, according to a process condition of the process step, a quantity of the plurality of time periods, process time of each of the plurality of time periods, and the value of the CEX phase locking delay angle of each of the plurality of time periods of the process step are determined.

5. The plasma process method according to claim 4, further comprising identifying a correspondence of the process condition with the quantity of the plurality of time periods, the process time of each of the plurality of time periods, and the value of the CEX phase locking delay angle of each of the plurality of time periods.

6. The plasma process method according to claim 4, wherein:
   the process condition includes a process type and a process parameter;
   the process type includes a cleaning process, an etching process, and a deposition process; and
   the process parameter includes a type and flow of a process gas.

7. The plasma process method according to claim 1, wherein:
   the at least one pair of the main power supply and the secondary power supply includes a first radio frequency (RF) power supply as the main power supply and a second RF power supply as the secondary power supply; and
   by adjusting a phase angle of an output wave of the first RF power supply and/or a phase angle of an output wave of the second RF power supply, a phase difference between the first RF power supply and the second RF power supply is changed to obtain the value of the CEX phase locking delay angle.

8. The plasma process method according to claim 1, wherein:
   the at least one pair of the main power supply and the secondary power supply includes a first radio frequency (RF) power supply as the main power supply and a plurality of second RF power supplies as the secondary power supply; and
   by adjusting a phase angle of an output wave of the first RF power supply and/or phase angles of output waves of the plurality of second RF power supplies, phase differences between the first RF power supply and the plurality of second RF power supplies are changed to obtain the value of the CEX phase locking delay angle.

9. The plasma process method according to claim 1, wherein:
   the plasma process method is used for an inductively coupled plasma apparatus, a capacitively coupled plasma apparatus, a microwave plasma apparatus, and an electron cyclotron resonance plasma apparatus.

10. A plasma process method, wherein a plasma is excited using at least one pair of a main power supply and a secondary power supply, the plasma process method comprising:
    at least a process step;
    dividing each process step into a plurality of time periods; and
    maintaining a common exciter (CEX) phase locking delay angle of the at least one pair of the main power supply and the secondary power supply corresponding to each of the time periods at a value to provide an increased plasma angular distribution uniformity, wherein values of CEX phase locking delay angles of the plurality of time periods in each process step are distributed non-periodically, and wherein:

the at least one pair of the main power supply and the secondary power supply includes a plurality of RF power supplies arranged in order, two neighboring RF power supplies of the plurality of RF power supplies forming a pair of main power supply and secondary power supply, a front RF power supply in the pair of main power supply and secondary power supply being used as the main power supply, and a rear RF power supply in the pair of main power supply and secondary power supply being used as the secondary power supply;

by adjusting a phase angle of an output wave of the main power supply and/or a phase angle of an output wave of the secondary power supply, a phase difference between the main power supply and the secondary power supply is changed to obtain the value of the CEX phase locking delay angle.

11. The plasma process method according to claim 10, wherein the values of the CEX phase locking delay angles of the plurality of time periods of each process step change in steps.

12. The plasma process method according to claim 10, wherein the at least a process step includes a plurality of process steps, and the plurality of process steps are performed simultaneously.

13. The plasma process method according to claim 10, wherein for each process step, according to a process condition of the process step, a quantity of the plurality of time periods, process time of each of the plurality of time periods, and the value of the CEX phase locking delay angle of each of the plurality of time periods of the process step are determined.

14. The plasma process method according to claim 12, further comprising identifying a correspondence of the process condition with the quantity of the plurality of time periods, the process time of each of the plurality of time periods, and the value of the CEX phase locking delay angle of each of the plurality of time periods.

15. The plasma process method according to claim 12, wherein:

the process condition includes a process type and a process parameter;

the process type includes a cleaning process, an etching process, and a deposition process; and the process parameter includes a type and flow of a process gas.

16. The plasma process method according to claim 10, wherein:

the plasma process method is used for an inductively coupled plasma apparatus, a capacitively coupled plasma apparatus, a microwave plasma apparatus, and an electron cyclotron resonance plasma apparatus.

* * * * *